United States Patent
Choi et al.

(10) Patent No.: US 10,658,015 B2
(45) Date of Patent: May 19, 2020

(54) SEMICONDUCTOR DEVICES

(71) Applicant: SK hynix Inc., Icheon-si, Gyeonggi-do (KR)

(72) Inventors: Geun Ho Choi, Icheon-si (KR); Min Su Park, Seoul (KR); Sun Myung Choi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/212,545

(22) Filed: Dec. 6, 2018

(65) Prior Publication Data
US 2019/0325927 A1    Oct. 24, 2019

(30) Foreign Application Priority Data

Apr. 23, 2018  (KR) .................. 10-2018-0047010

(51) Int. Cl.
| | | |
|---|---|---|
| *G11C 7/10* | (2006.01) | |
| *G11C 11/4076* | (2006.01) | |
| *G11C 7/22* | (2006.01) | |
| *G11C 11/409* | (2006.01) | |

(52) U.S. Cl.
CPC .......... *G11C 7/1018* (2013.01); *G11C 7/1093* (2013.01); *G11C 7/22* (2013.01); *G11C 11/409* (2013.01); *G11C 11/4076* (2013.01)

(58) Field of Classification Search
CPC ... G11C 7/1018; G11C 7/1093; G11C 11/409; G11C 7/22; G11C 11/4076; G11C 19/28; G11C 7/222; G11C 2207/2281
See application file for complete search history.

(56) References Cited

U.S. PATENT DOCUMENTS

| | | | |
|---|---|---|---|
| 7,668,039 B2 | 2/2010 | Fujisawa | |
| 2010/0164572 A1* | 7/2010 | Kim ..................... | G11C 7/1045 327/158 |
| 2014/0254287 A1* | 9/2014 | Lee ...................... | G11C 7/1027 365/189.05 |

FOREIGN PATENT DOCUMENTS

KR    1020170063237 A    6/2017

* cited by examiner

*Primary Examiner* — Mohammed A Bashar
(74) *Attorney, Agent, or Firm* — William Park & Associates Ltd.

(57) ABSTRACT

A semiconductor device includes a shift register and a control signal generation circuit. The shift register generates shifted pulses, wherein a number of the shifted pulses is controlled according to a mode of a burst length. The control signal generation circuit generates a control signal for setting a burst operation period according to a period during which the shifted pulses are created. The burst operation period is a period during which a burst operation is performed.

20 Claims, 19 Drawing Sheets

22

SEMICONDUCTOR DEVICES

CROSS-REFERENCE TO RELATED APPLICATIONS

The present application claims priority under 35 U.S.C. 119(a) to Korean Application No. 10-2018-0047010, filed on Apr. 23, 2018, which is incorporated herein by reference in its entirety.

BACKGROUND

1. Technical Field

Embodiments of the present disclosure relate to semiconductor devices performing a burst operation according to a burst length.

2. Related Art

Semiconductor devices provide a burst operation for sequentially receiving or outputting data. For a burst operation, data having a plurality of bits corresponding to a burst length determined by a mode register set are sequentially inputted to or outputted from a semiconductor device.

The burst length for performing a burst operation may be set as 'BL8,' 'BL16,' or the like. If the burst length is set as 'BL8,' eight-bit data (i.e., data having eight bits) may be sequentially inputted to or outputted from a semiconductor device by a write command or a read command, respectively. If the burst length is set as 'BL16,' sixteen-bit data (i.e., data having sixteen bits) may be sequentially inputted to or outputted from the semiconductor device by the write command or the read command, respectively.

SUMMARY

In accordance with the present teachings, a semiconductor device includes a shift register and a control signal generation circuit. The shift register generates shifted pulses, wherein a number of the shifted pulses is controlled according to a mode of a burst length. The control signal generation circuit generates a control signal for setting a burst operation period according to a period during which the shifted pulses are created. The burst operation period is a period during which a burst operation is performed.

Also in accordance with the present teachings, a semiconductor device includes a first control signal generation circuit, a second control signal generation circuit, and a control signal synthesis circuit. The first control signal generation circuit is configured to generate a first control signal for setting a preamble period which is controlled according to pre-codes. The second control signal generation circuit is configured to generate a second control signal for setting a period for a burst operation in response to post-codes and shifted pulses. The number of shifted pulses is controlled according to a mode of a burst length. The control signal synthesis circuit is configured to synthesize the first control signal and the second control signal to generate a synthesized control signal.

DETAILED DESCRIPTION

Various embodiments of the present disclosure are described hereinafter with reference to the accompanying drawings. However, the embodiments described herein are for illustrative purposes only and are not intended to limit the scope of the present disclosure.

Figure 1:
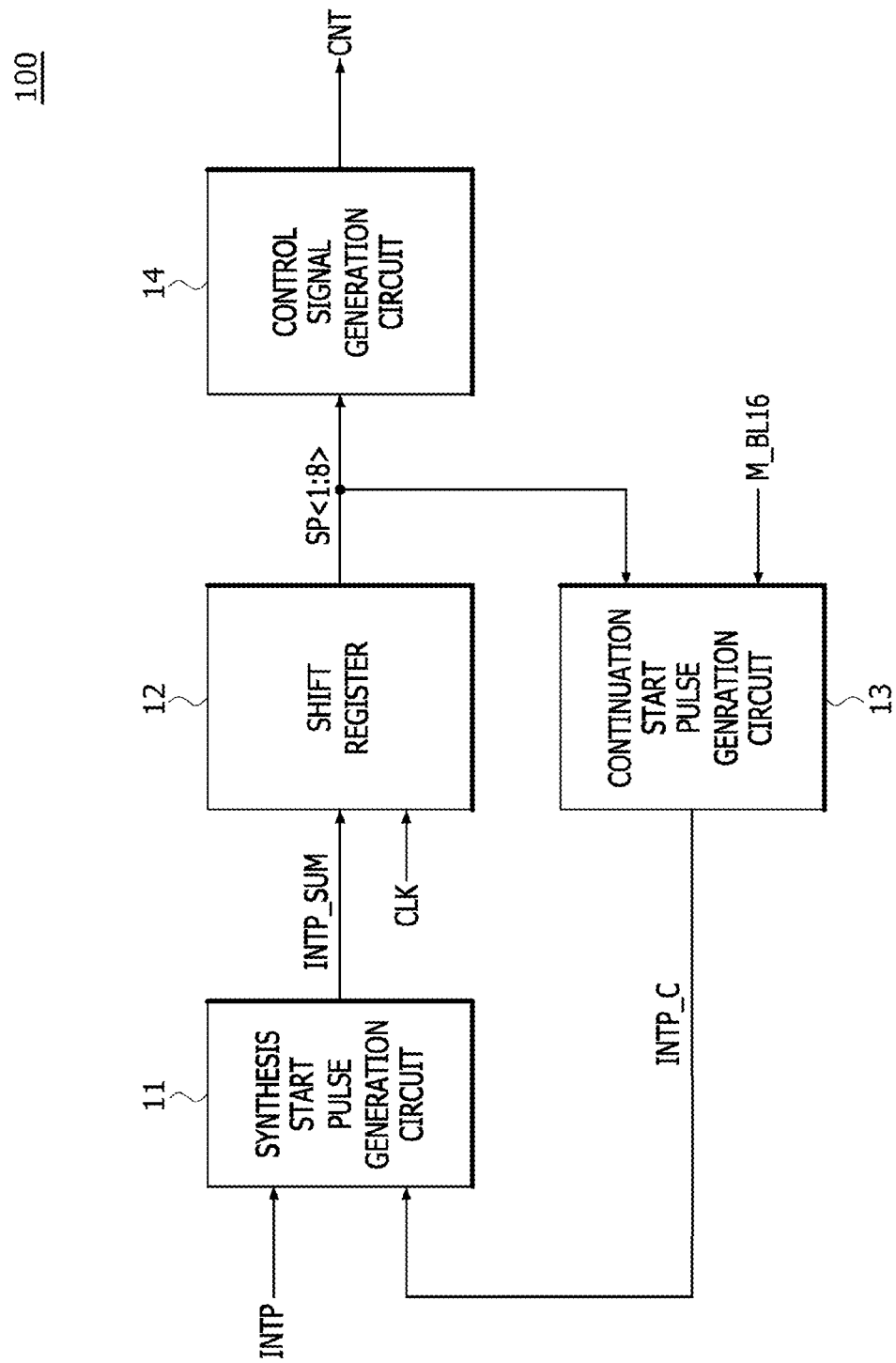
FIG. 1 shows a block diagram illustrating a configuration of a semiconductor device according to an embodiment of the present disclosure.

As illustrated in FIG. 1, a semiconductor device 100 according to an embodiment may include a synthesis start pulse generation circuit 11, a shift register 12, a continuation start pulse generation circuit 13, and a control signal generation circuit 14.

The synthesis start pulse generation circuit 11 may generate a synthesis start pulse INTP_SUM in response to a start pulse INTP and a continuation start pulse INTP_C. The synthesis start pulse generation circuit 11 may generate the synthesis start pulse INTP_SUM if the start pulse INTP or the continuation start pulse INTP_C is created. The start pulse INTP may be generated to perform a data input/output (I/O) operation according to a read command or a write command. A configuration and operation of the synthesis start pulse generation circuit 11 are described later with reference to FIG. 2.

The shift register 12 may shift the synthesis start pulse INTP_SUM in response to a clock signal CLK to generate first to eighth shifted pulses SP<1:8>. The shift register 12 may be synchronized with a predetermined edge of the clock signal CLK to generate the first shifted pulse SP<1> from the synthesis start pulse INTP_SUM. For an embodiment, the predetermined edge of the clock signal CLK may be a rising edge of the clock signal CLK corresponding to a point in time when a logic level of the clock signal CLK is changed from a logic "low" level to a logic "high" level. The shift register 12 may shift the first shifted pulse SP<1> by one cycle of the clock signal CLK to generate the second shifted pulse SP<2>. The shift register 12 may shift the second shifted pulse SP<2> by one cycle of the clock signal CLK to generate the third shifted pulse SP<3>. The shift register 12 may shift the third shifted pulse SP<3> by one cycle of the clock signal CLK to generate the fourth shifted pulse SP<4>. The shift register 12 may shift the fourth shifted pulse SP<4> by one cycle of the clock signal CLK to generate the fifth shifted pulse SP<5>. The shift register 12 may shift the fifth shifted pulse SP<5> by one cycle of the clock signal CLK to generate the sixth shifted pulse SP<6>. The shift register 12 may shift the sixth shifted pulse SP<6> by one cycle of the clock signal CLK to generate the seventh shifted pulse SP<7>. The shift register 12 may shift the seventh shifted pulse SP<7> by one cycle of the clock signal CLK to generate the eighth shifted pulse SP<8>. Stated more generally, the shift register 12 may shift the $n^{th}$ shifted pulse SP<n> by one cycle of the clock signal CLK to generate the $(n+1)^{th}$ shifted pulse SP<n+1>. Although the present embodiment describes an example in which the shift register 12 is configured to generate the first to eighth shifted pulses SP<1:8> for a burst operation while a burst length is set as 'BL8' and 'BL16,' the present disclosure is not limited thereto. For example, the number of the shifted pulses generated by the shift register 12 may be set differently for different embodiments. If the burst length is set as 'BL8,' eight bits of data may be sequentially inputted to or outputted from the semiconductor device 100 by the write command or the read command, respectively. If the burst length is set as 'BL16,' sixteen bits of data may be sequentially inputted to or outputted from the semiconductor device 100 by the write command or the read command, respectively. A configuration and operation of the shift register 12 are described later with reference to FIG. 3.

The continuation start pulse generation circuit 13 may generate the continuation start pulse INTP_C in response to the first to eighth shifted pulses SP<1:8> and a burst length information signal M_BL16. The continuation start pulse generation circuit 13 may generate the continuation start pulse INTP_C using at least one of the first to eighth shifted pulses SP<1:8> to perform a burst operation according to a predetermined burst length. The burst length information signal M_BL16 may be enabled to perform a burst operation while the burst length is set as 'BL16.' The continuation start pulse generation circuit 13 may output the eighth shifted pulse SP<8> as the continuation start pulse INTP_C after one of the first to seventh shifted pulses SP<1:7> is created while the burst length is set as 'BL16.' A configuration and operation of the continuation start pulse generation circuit 13 are described later with reference to FIG. 4.

The control signal generation circuit 14 may generate a control signal CNT in response to the first to eighth shifted pulses SP<1:8>. The control signal generation circuit 14 may generate the control signal CNT having an enabled state during a period in which the first to eighth shifted pulses SP<1:8> are created. The control signal CNT may be generated to be enabled during a burst operation performed according to the predetermined burst length. A configuration and operation of the control signal generation circuit 14 are described later with reference to FIG. 5.

Figure 2:
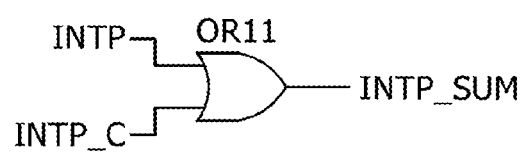
FIG. 2 shows a circuit diagram illustrating an example of a synthesis start pulse generation circuit included in the semiconductor device of FIG. 1.

Referring to FIG. 2, the synthesis start pulse generation circuit 11 may include an OR gate OR11. The OR gate OR11 may receive the start pulse INTP and the continuation start pulse INTP_C and may perform a logical OR operation of the start pulse INTP and the continuation start pulse INTP_C to generate the synthesis start pulse INTP_SUM. The OR gate OR11 may generate the synthesis start pulse INTP_SUM if the start pulse INTP or the continuation start pulse INTP_C is created.

Figure 3:
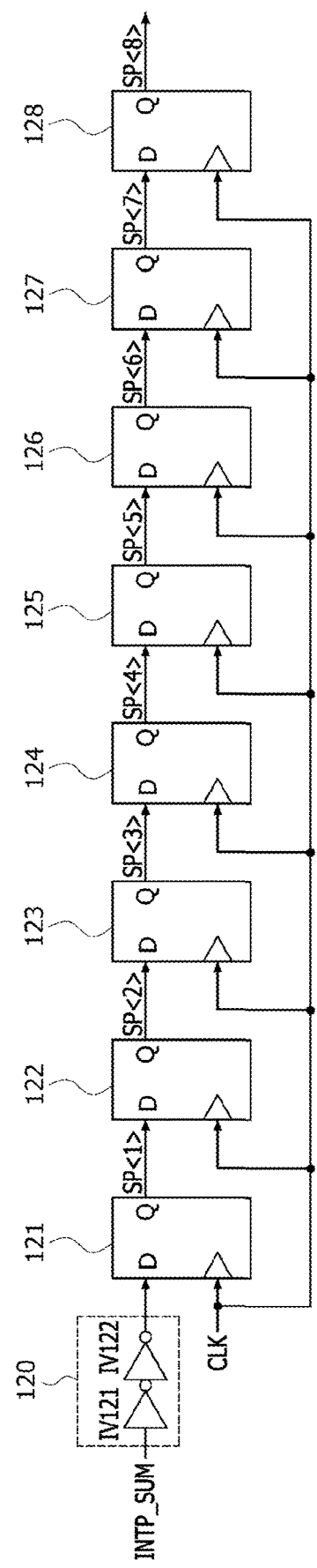
FIG. 3 shows a circuit diagram illustrating an example of a shift register included in the semiconductor device of FIG. 1.

Referring to FIG. 3, the shift register 12 may include a delay circuit 120 and first to eighth latch circuits 121~128. As used herein, the tilde "~" indicates a range of components. For example, "latch circuits 121~128" here indicates the latch circuits 121, 122, 123, 124, 125, 126, 127, and 128 shown in FIG. 3.

The delay circuit 120 may include inverters IV121 and IV122. The delay circuit 120 may delay the synthesis start pulse INTP_SUM by a delay period set by the inverters IV121 and IV122 to output the delayed synthesis start pulse. Even though the synthesis start pulse INTP_SUM is generated in synchronization with a rising edge of the clock signal CLK, the first shifted pulse SP<1> may be created in synchronization with a rising edge of the clock signal CLK after the synthesis start pulse INTP_SUM is generated because the synthesis start pulse INTP_SUM is delayed and outputted by the delay circuit 120.

Each of the first to eighth latch circuits 121~128 may be realized using a D-flipflop. The first latch circuit 121 may shift an output pulse of the delay circuit 120 in synchronization with a first rising edge of the clock signal CLK to generate and output the first shifted pulse SP<1> after the synthesis start pulse INTP_SUM is generated. The second latch circuit 122 may shift the first shifted pulse SP<1> in synchronization with a second rising edge of the clock signal CLK to generate and output the second shifted pulse SP<2> after the synthesis start pulse INTP_SUM is generated. The third latch circuit 123 may shift the second shifted pulse SP<2> in synchronization with a third rising edge of the clock signal CLK to generate and output the third shifted pulse SP<3> after the synthesis start pulse INTP_SUM is generated. The fourth latch circuit 124 may shift the third shifted pulse SP<3> in synchronization with a fourth rising edge of the clock signal CLK to generate and output the fourth shifted pulse SP<4> after the synthesis start pulse INTP_SUM is generated. The fifth latch circuit 125 may shift the fourth shifted pulse SP<4> in synchronization with a fifth rising edge of the clock signal CLK to generate and output the fifth shifted pulse SP<5> after the synthesis start pulse INTP_SUM is generated. The sixth latch circuit 126 may shift the fifth shifted pulse SP<5> in synchronization with a sixth rising edge of the clock signal CLK to generate and output the sixth shifted pulse SP<6> after the synthesis start pulse INTP_SUM is generated. The seventh latch circuit 127 may shift the sixth shifted pulse SP<6> in synchronization with a seventh rising edge of the clock signal CLK to generate and output the seventh shifted pulse SP<7> after the synthesis start pulse INTP_SUM is generated. The eighth latch circuit 128 may shift the seventh shifted pulse SP<7> in synchronization with an eighth rising edge of the clock signal CLK to generate and output the eighth shifted pulse SP<8> after the synthesis start pulse INTP_SUM is generated.

The shift register 12 may shift the synthesis start pulse INTP_SUM until a point in time when a first rising edge of the clock signal CLK occurs to generate the first shifted pulse SP<1> after the synthesis start pulse INTP_SUM is generated. The shift register 12 may shift the synthesis start pulse INTP_SUM until a point in time when a second rising edge of the clock signal CLK occurs to generate the second shifted pulse SP<2> after the synthesis start pulse INTP_SUM is generated. The shift register 12 may shift the synthesis start pulse INTP_SUM until a point in time when a third rising edge of the clock signal CLK occurs to generate the third shifted pulse SP<3> after the synthesis start pulse INTP_SUM is generated. The shift register 12 may shift the synthesis start pulse INTP_SUM until a point in time when a fourth rising edge of the clock signal CLK occurs to generate the fourth shifted pulse SP<4> after the synthesis start pulse INTP_SUM is generated. The shift register 12 may shift the synthesis start pulse INTP_SUM until a point in time when a fifth rising edge of the clock signal CLK occurs to generate the fifth shifted pulse SP<5> after the synthesis start pulse INTP_SUM is generated. The shift register 12 may shift the synthesis start pulse INTP_SUM until a point in time when a sixth rising edge of the clock signal CLK occurs to generate the sixth shifted pulse SP<6> after the synthesis start pulse INTP_SUM is generated. The shift register 12 may shift the synthesis start pulse INTP_SUM until a point in time when a seventh rising edge of the clock signal CLK occurs to generate the seventh shifted pulse SP<7> after the synthesis start pulse INTP_SUM is generated. The shift register 12 may shift the synthesis start pulse INTP_SUM until a point in time when an eighth rising edge of the clock signal CLK occurs to generate the eighth shifted pulse SP<8> after the synthesis start pulse INTP_SUM is generated.

Figure 4:
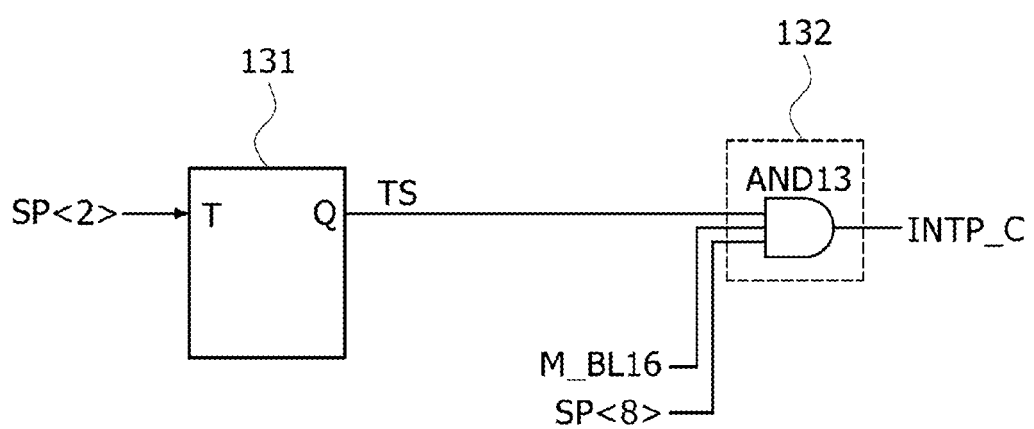
FIG. 4 shows a circuit diagram illustrating an example of a continuation start pulse generation circuit included in the semiconductor device of FIG. 1.

Referring to FIG. 4, the continuation start pulse generation circuit 13 may include a transmission signal generation circuit 131 and a continuation start pulse output circuit 132. The transmission signal generation circuit 131 may be realized using a T-flipflop. The transmission signal generation circuit 131 may generate a transmission signal TS whose level transition occurs if the second shifted pulse SP<2> is created. For example, the transmission signal generation circuit 131 may generate the transmission signal TS whose level is changed from a logic "low" level to a logic "high" level if the second shifted pulse SP<2> is firstly created, whose level is changed from a logic "high" level to a logic "low" level if the second shifted pulse SP<2> is secondly created, and whose level is changed from a logic "low" level to a logic "high" level if the second shifted pulse SP<2> is thirdly created. The continuation start pulse output circuit 132 may include an AND gate AND13. The AND gate AND13 may perform a logical AND operation of the transmission signal TS, the burst length information signal M_BL16 and the eighth shifted pulse SP<8> to generate the continuation start pulse INTP_C. The continuation start pulse output circuit 132 may generate the continuation start pulse INTP_C from the eighth shifted pulse SP<8> in response to the transmission signal TS and the burst length information signal M_BL16. The continuation start pulse output circuit 132 may buffer the eighth shifted pulse SP<8> to output the buffered pulse as the continuation start pulse INTP_C during a period that the transmission signal TS has a logic "high" level while the burst length is set as 'BL16.' The continuation start pulse output circuit 132 may interrupt generation of the continuation start pulse INTP_C in response to the burst length information signal M_BL16 having a logic "low" level while the burst length is set as 'BL8.'

Figure 5:
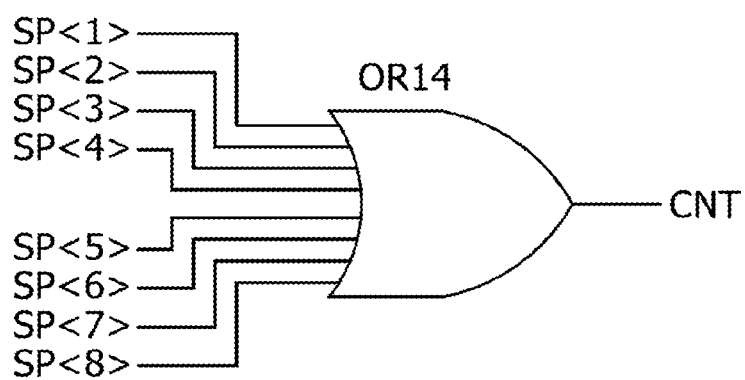
FIG. 5 shows a circuit diagram illustrating an example of a control signal generation circuit included in the semiconductor device of FIG. 1.

Referring to FIG. 5, the control signal generation circuit 14 may include an OR gate OR14. The OR gate OR14 may perform a logical OR operation of the first to eighth shifted pulses SP<1:8> to generate the control signal CNT. The control signal generation circuit 14 may generate the control signal CNT having an enabled state during a period that the first to eighth shifted pulses SP<1:8> are created. The control signal CNT may be generated to be enabled during a burst operation performed according to the predetermined burst length.

Operations of the semiconductor device 100 having the aforementioned configuration are described hereinafter with reference to FIGS. 6, 7, and 8 in conjunction with a burst operation performed while the burst length is set as 'BL8,' a burst operation performed while the burst length is set as 'BL16,' and burst operations sequentially performed while the burst length is set as 'BL16.'

Figure 6:
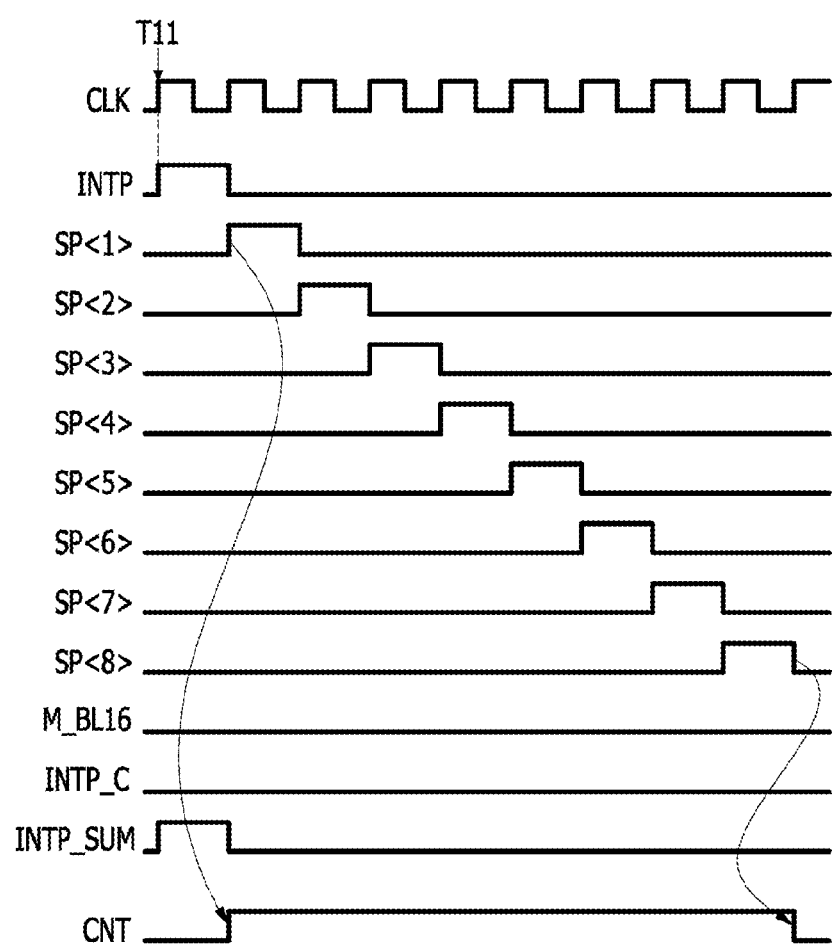
FIGS. 6, 7, and 8 show timing diagrams illustrating operations of the semiconductor device shown in FIGS. 1 to 5.

Referring to FIG. 6, the burst operation performed while the burst length information signal M_BL16 has a logic "low" level according to the burst length set as 'BL8' is illustrated. For an embodiment, this corresponds to the burst length being set to a first mode. As illustrated in FIG. 6, if the start pulse INTP is created in synchronization with a point in time "T11," the start pulse INTP may be outputted as the synthesis start pulse INTP_SUM. The synthesis start pulse INTP_SUM may be repeatedly shifted in synchronization with pulses of the clock signal CLK to sequentially generate the first to eighth shifted pulses SP<1:8>. An enabled period of the control signal CNT for the burst operation performed while the burst length is set as 'BL8' may be set to be a period from a point in time when the first shifted pulse SP<1> is created until a point in time when occurrence of the eighth shifted pulse SP<8> terminates.

Figure 7:
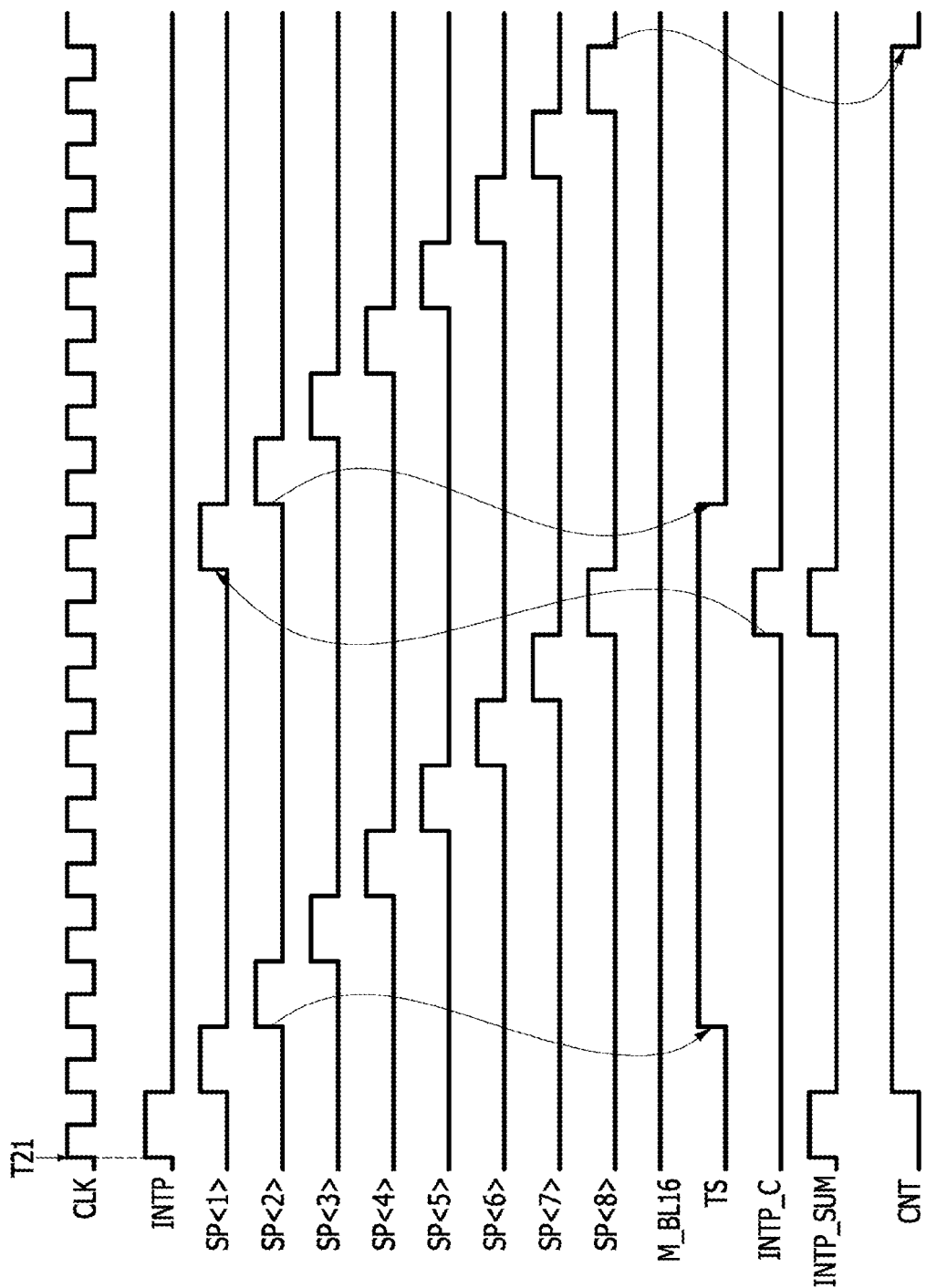

Referring to FIG. 7, the burst operation performed while the burst length information signal M_BL16 has a logic "high" level according to the burst length set as 'BL16' is illustrated. For an embodiment, this corresponds to the burst length being set to a second mode. As illustrated in FIG. 7, if the start pulse INTP is created in synchronization with a point in time "T21," the start pulse INTP may be outputted as the synthesis start pulse INTP_SUM. The synthesis start pulse INTP_SUM may be repeatedly shifted in synchronization with pulses of the clock signal CLK to sequentially generate the first to eighth shifted pulses SP<1:8> firstly. A level of the transmission signal TS may be changed from a logic "low" level to a logic "high" level in synchronization with a point in time that the second shifted pulse SP<2> is firstly created. The eighth shifted pulse SP<8> created while the transmission signal TS has a logic "high" level may be outputted as the continuation start pulse INTP_C. If the continuation start pulse INTP_C is created, the synthesis start pulse INTP_SUM may be generated and the synthesis start pulse INTP_SUM may be repeatedly shifted in synchronization with pulses of the clock signal CLK to sequentially generate the first to eighth shifted pulses SP<1:8> secondly. A level of the transmission signal TS may be changed from a logic "high" level to a logic "low" level in synchronization with a point in time that the second shifted pulse SP<2> is secondly created. An enabled period of the control signal CNT for the burst operation performed while the burst length is set as 'BL16' may be set to be a period from a point in time that the first shifted pulse SP<1> is firstly created until a point in time when the second occurrence of the eighth shifted pulse SP<8> terminates.

Figure 8:
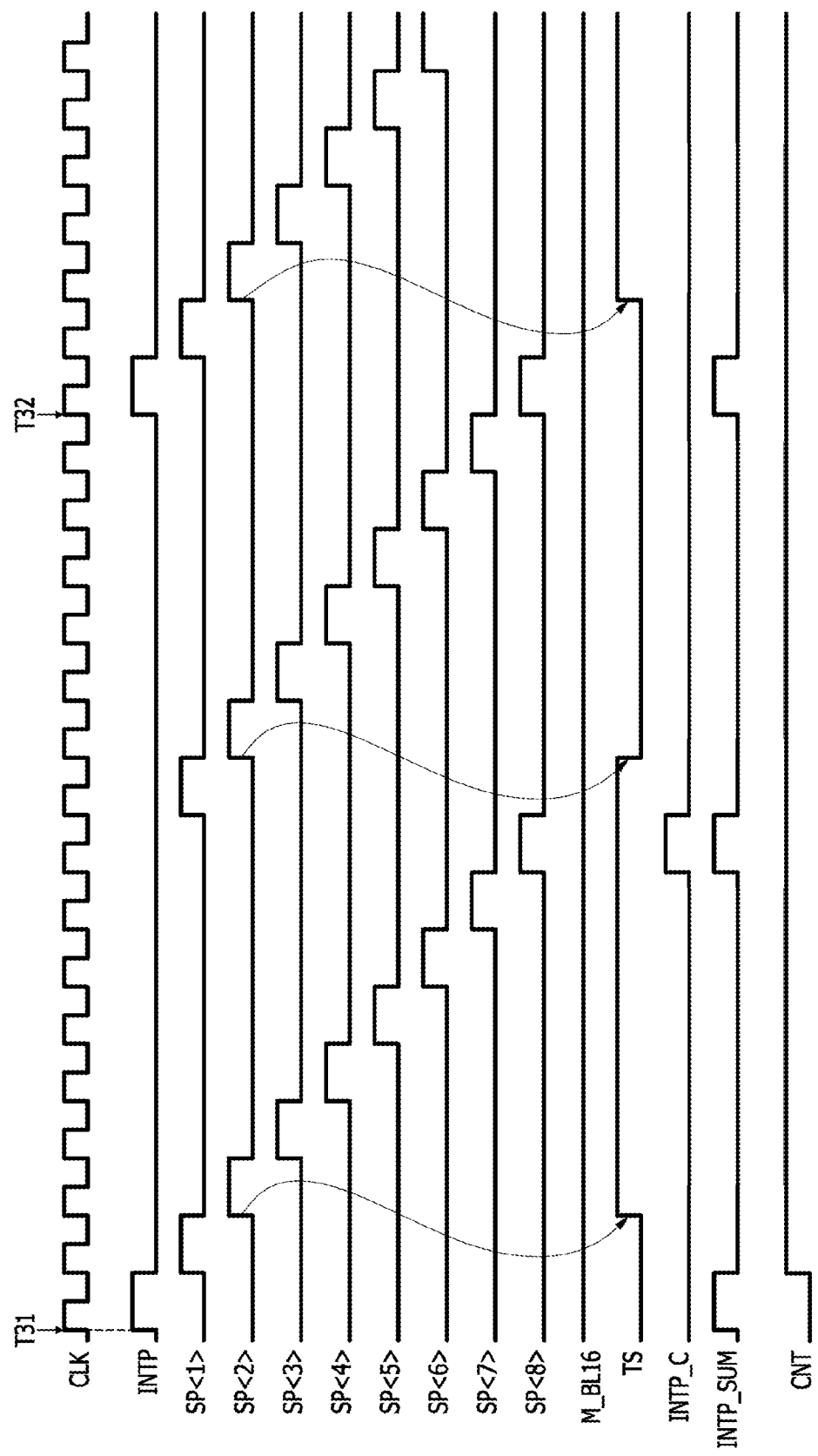

Referring to FIG. 8, the burst operations continuously performed while the burst length information signal M_BL16 has a logic "high" level according to the burst length set as 'BL16' is illustrated. As illustrated in FIG. 8, if the start pulse INTP is firstly created in synchronization with a point in time "T31," the start pulse INTP may be outputted as the synthesis start pulse INTP_SUM. The synthesis start pulse INTP_SUM may be repeatedly shifted in synchronization with pulses of the clock signal CLK to sequentially generate the first to eighth shifted pulses SP<1:8> firstly (i.e., a first time). A level of the transmission signal TS may be changed from a logic "low" level to a logic "high" level in synchronization with a point in time when the second shifted pulse SP<2> is firstly created. The eighth shifted pulse SP<8> created while the transmission signal TS has a logic "high" level may be outputted as the continuation start pulse INTP_C. If the continuation start pulse INTP_C is created, the synthesis start pulse INTP_SUM may be generated and the synthesis start pulse INTP_SUM may be repeatedly shifted in synchronization with pulses of the clock signal CLK to sequentially generate the first to eighth shifted pulses SP<1:8> secondly (i.e., a second time). A level of the transmission signal TS may be changed from a logic "high" level to a logic "low" level in synchronization with a point in time when the second shifted pulse SP<2> is secondly created. If the start pulse INTP is secondly created in synchronization with a point in time "T32," the start pulse INTP may be outputted as the synthesis start pulse INTP_SUM. The synthesis start pulse INTP_SUM may be repeatedly shifted in synchronization with pulses of the clock signal CLK to sequentially generate the first to eighth shifted pulses SP<1:8> thirdly (i.e., a third time). A level of the transmission signal TS may be changed from a logic "low" level to a logic "high" level in synchronization with a point in time when the second shifted pulse SP<2> is thirdly created. An enabled period of the control signal CNT for the burst operations continuously performed while the burst length is set as 'BL16' may be set to be a period from a point in time when the first shifted pulse SP<1> is firstly created until a point in time when the continuous burst operations terminates.

Figure 9:
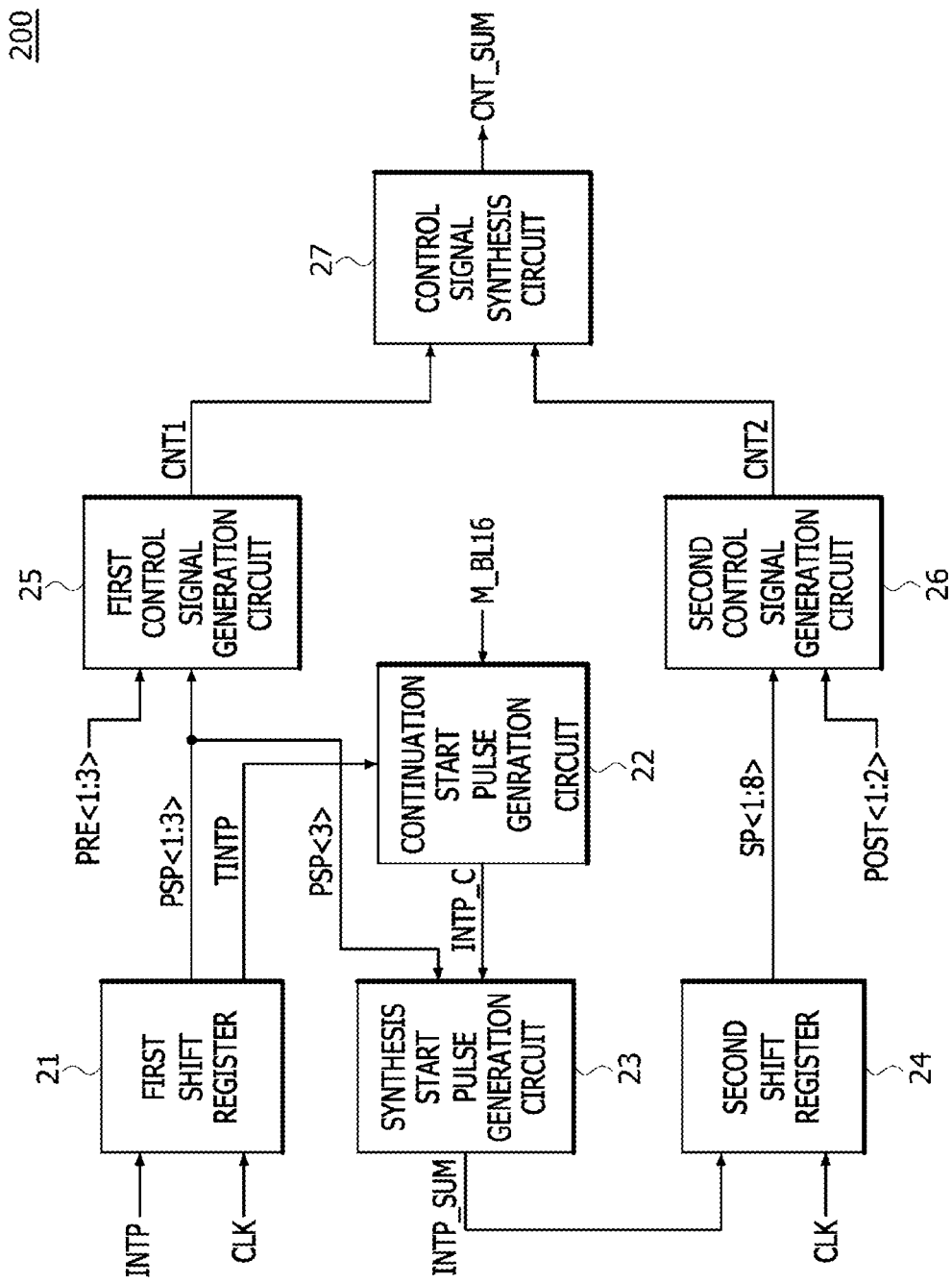
FIG. 9 shows a block diagram illustrating a configuration of a semiconductor device according to another embodiment of the present disclosure.

As illustrated in FIG. 9, a semiconductor device 200 according to another embodiment may include a first shift register 21, a continuation start pulse generation circuit 22, a synthesis start pulse generation circuit 23, a second shift register 24, a first control signal generation circuit 25, a second control signal generation circuit 26, and a control signal synthesis circuit 27.

The first shift register 21 may shift a start pulse INTP in response to a clock signal CLK to generate first to third pre-shifted pulses PSP<1:3> and a transmission start pulse TINTP. The start pulse INTP may be generated to perform a data input/output (I/O) operation according to a read command or a write command. The first shift register 21 may generate the first pre-shifted pulse PSP<1> from the start pulse INTP in synchronization with a predetermined edge of the clock signal CLK. The predetermined edge of the clock signal CLK may be set as a rising edge of the clock signal CLK corresponding to a point in time when a logic level of the clock signal CLK changes from a logic "low" level to a logic "high" level. The first shift register 21 may shift the first pre-shifted pulse PSP<1> by one cycle of the clock signal CLK to generate the second pre-shifted pulse PSP<2>. The first shift register 21 may shift the second pre-shifted pulse PSP<2> by one cycle of the clock signal CLK to generate the third pre-shifted pulse PSP<3>. The first to third pre-shifted pulses PSP<1:3> may be generated to set a preamble period before a burst operation according to a burst length is performed. The first shift register 21 may shift the third pre-shifted pulse PSP<3> by a period corresponding to 'N' times the cycle of the clock signal CLK to generate the transmission start pulse TINTP. For an embodiment, the number 'N' may be set as '8' for a burst operation that is provided when the burst length is set as 'BL8.' A configuration and operation of the first shift register 21 are described later with reference to FIG. 10.

The continuation start pulse generation circuit 22 may generate a continuation start pulse INTP_C in response to the transmission start pulse TINTP and a burst length information signal M_BL16. The burst length information signal M_BL16 may be enabled to perform a burst operation while the burst length is set to be 'BL16.' The continuation start pulse generation circuit 22 may output the transmission start pulse TINTP as the continuation start pulse INTP_C while the burst length is set as 'BL16.' A configuration and operation of the continuation start pulse generation circuit 22 are described later with reference to FIG. 11.

The synthesis start pulse generation circuit 23 may generate a synthesis start pulse INTP_SUM in response to the third pre-shifted pulse PSP<3> and the continuation start pulse INTP_C. The synthesis start pulse generation circuit 23 may generate the synthesis start pulse INTP_SUM if the third pre-shifted pulse PSP<3> or the continuation start pulse INTP_C is created. A configuration and operation of the synthesis start pulse generation circuit 23 are described later with reference to FIG. 12.

The second shift register 24 may shift the synthesis start pulse INTP_SUM in response to the clock signal CLK to generate first to eighth shifted pulses SP<1:8>. The second shift register 24 may generate the first shifted pulse SP<1> from the synthesis start pulse INTP_SUM in synchronization with a predetermined edge of the clock signal CLK. The second shift register 24 may shift the first shifted pulse SP<1> by one cycle of the clock signal CLK to generate the second shifted pulse SP<2>. The second shift register 24 may shift the second shifted pulse SP<2> by one cycle of the clock signal CLK to generate the third shifted pulse SP<3>. The second shift register 24 may shift the third shifted pulse SP<3> by one cycle of the clock signal CLK to generate the fourth shifted pulse SP<4>. The second shift register 24 may shift the fourth shifted pulse SP<4> by one cycle of the clock signal CLK to generate the fifth shifted pulse SP<5>. The second shift register 24 may shift the fifth shifted pulse SP<5> by one cycle of the clock signal CLK to generate the sixth shifted pulse SP<6>. The second shift register 24 may shift the sixth shifted pulse SP<6> by one cycle of the clock signal CLK to generate the seventh shifted pulse SP<7>. The second shift register 24 may shift the seventh shifted pulse SP<7> by one cycle of the clock signal CLK to generate the eighth shifted pulse SP<8>. Although the illustrated embodiment describes an example in which the second shift register 24 is configured to generate the first to eighth shifted pulses SP<1:8> for burst operations performed while the burst length is set as 'BL8' and 'BL16,' the present disclosure is not limited thereto. For example, the number of the shifted pulses generated by the second shift register 24 may be set differently for different embodiments. A configuration and operation of the second shift register 24 are described later with reference to FIG. 13.

The first control signal generation circuit 25 may generate a first control signal CNT1 in response to first to third pre-codes PRE<1:3> and the first to third pre-shifted pulses PSP<1:3>. The first control signal generation circuit 25 may generate the first control signal CNT1 whose enabled period is set by at least one of the first to third pre-shifted pulses PSP<1:3> according to a logic level combination of the first to third pre-codes PRE<1:3>. For example, the first control signal CNT1 may be generated from the third pre-shifted pulse PSP<3> if the first to third pre-codes PRE<1:3> have a logic level combination of '001,' the first control signal CNT1 may be generated by performing a logical OR operation of the second and third pre-shifted pulses PSP<2:3> if the first to third pre-codes PRE<1:3> have a logic level combination of '011,' and the first control signal CNT1 may be generated by performing a logical OR operation of the first to third pre-shifted pulses PSP<1:3> if the first to third pre-codes PRE<1:3> have a logic level combination of '111.' For the first to third pre-codes PRE<1:3>, the logic level combination of '001' means that both of the first and second pre-codes PRE<1:2> have a logic "low" level and the third pre-code PRE<3> has a logic "high" level. A configuration and operation of the first control signal generation circuit 25 are described later with reference to FIG. 14.

The second control signal generation circuit 26 may generate a second control signal CNT2 in response to first and second post-codes POST<1:2> and the first to eighth shifted pulses SP<1:8>. If the burst length is set as 'BL8,' the first and second post-codes POST<1:2> may have an initialized logic level combination. For an embodiment, the initialized logic level combination of the first and second post-codes POST<1:2> may be set to be '11' corresponding to a case where both of the first and second post-codes POST<1:2> have a logic "high" level. If the burst length is set as 'BL16,' the first and second post-codes POST<1:2> may maintain an initialized logic level combination while a burst operation for a first 'BL8' is performed and may have a different logic level combination from the initialized logic level combination during a burst operation for a second 'BL8' in order to control a period that the burst operation for the second 'BL8' is performed. The second control signal generation circuit 26 may set an enabled period of the second control signal CNT2 in response to the first to eighth shifted pulses SP<1:8> according to a logic level combination of the first and second post-codes POST<1:2>. For example, the second control signal generation circuit 26 may generate the second control signal CNT2 which is enabled during a period in which the first to eighth shifted pulses SP<1:8> are created if the first and second post-codes POST<1:2> are initialized to have the initialized logic level combination of '11,' the second control signal generation circuit 26 may generate the second control signal CNT2 which is enabled during a period that the first to seventh shifted pulses SP<1:7> are created if the first and second post-codes POST<1:2> have a logic level combination of '10,' and the second control signal generation circuit 26 may generate the second control signal CNT2 which is enabled during a period that the first to sixth shifted pulses SP<1:6> are created if the first and second post-codes POST<1:2> have a logic level combination of '00.' For the first and second post-codes POST<1:2>, the logic level combination of '10' means that the first post-code POST<1> has a logic "high" level and the second post-code POST<2> has a logic "low" level. A configuration and operation of the second control signal generation circuit 26 are described later with reference to FIG. 15.

The control signal synthesis circuit 27 may synthesize the first control signal CNT1 and the second control signal CNT2 to generate a synthesized control signal CNT_SUM. The synthesized control signal CNT_SUM may be enabled during the preamble period that the first control signal CNT1 is enabled and during a burst operation period that the second control signal CNT2 is enabled. A configuration and operation of the control signal synthesis circuit 27 are described later with reference to FIG. 16.

Figure 10:
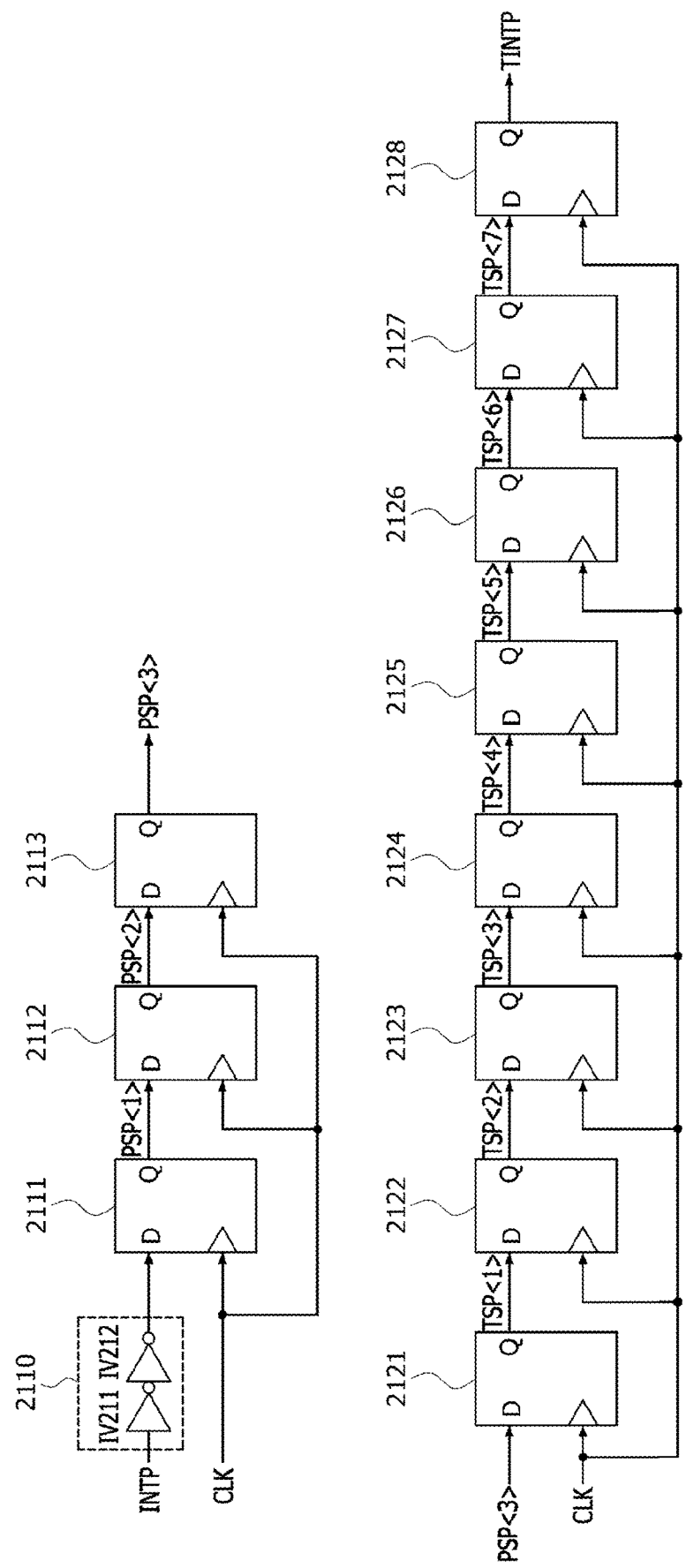
FIG. 10 shows a circuit diagram illustrating an example of a first shift register included in the semiconductor device of FIG. 9.

Referring to FIG. 10, the first shift register 21 may include a delay circuit 2110 and first to eleventh latch circuits 2111~2113 and 2121~2128.

The delay circuit 2110 may include inverters IV211 and IV212, which are cascaded. The delay circuit 2110 may delay the start pulse INTP by a predetermined delay period set by the inverters IV211 and IV212 and may output the delayed pulse as an output signal of the delay circuit 2110. Even though the start pulse INTP is generated in synchronization with a rising edge of the clock signal CLK, the first pre-shifted pulse PSP<1> may be created in synchronization with a rising edge of the clock signal CLK after the start pulse INTP is generated because the start pulse INTP is delayed and outputted by the delay circuit 2110.

Each of the first to eleventh latch circuits 2111~2113 and 2121~2128 may be realized using a D-flipflop. The first latch circuit 2111 may shift an output pulse of the delay circuit 2110 in synchronization with a first rising edge of the clock signal CLK to generate and output the first pre-shifted pulse PSP<1> after the start pulse INTP is generated. The second latch circuit 2112 may shift the first pre-shifted pulse PSP<1> in synchronization with a second rising edge of the clock signal CLK to generate and output the second pre-shifted pulse PSP<2> after the start pulse INTP is generated. The third latch circuit 2113 may shift the second pre-shifted pulse PSP<2> in synchronization with a third rising edge of the clock signal CLK to generate and output the third pre-shifted pulse PSP<3> after the start pulse INTP is generated. The fourth latch circuit 2121 may shift the third pre-shifted pulse PSP<3> in synchronization with a fourth rising edge of the clock signal CLK to generate and output a first transmission shifted pulse TSP<1> after the start pulse INTP is generated. The fifth latch circuit 2122 may shift the first transmission shifted pulse TSP<1> in synchronization with a fifth rising edge of the clock signal CLK to generate and output a second transmission shifted pulse TSP<2> after the start pulse INTP is generated. The sixth latch circuit 2123 may shift the second transmission shifted pulse TSP<2> in synchronization with a sixth rising edge of the clock signal CLK to generate and output a third transmission shifted pulse TSP<3> after the start pulse INTP is generated. The seventh latch circuit 2124 may shift the third transmission shifted pulse TSP<3> in synchronization with a seventh rising edge of the clock signal CLK to generate and output a fourth transmission shifted pulse TSP<4> after the start pulse INTP is generated. The eighth latch circuit 2125 may shift the fourth transmission shifted pulse TSP<4> in synchronization with an eighth rising edge of the clock signal CLK to generate and output a fifth transmission shifted pulse TSP<5> after the start pulse INTP is generated. The ninth latch circuit 2126 may shift the fifth transmission shifted pulse TSP<5> in synchronization with a ninth rising edge of the clock signal CLK to generate and output a sixth transmission shifted pulse TSP<6> after the start pulse INTP is generated. The tenth latch circuit 2127 may shift the sixth transmission shifted pulse TSP<6> in synchronization with a tenth rising edge of the clock signal CLK to generate and output a seventh transmission shifted pulse TSP<7> after the start pulse INTP is generated. The eleventh latch circuit 2128 may shift the seventh transmission shifted pulse TSP<7> in synchronization with an eleventh rising edge of the clock signal CLK to generate and output the shifted pulse as the transmission start pulse TINTP after the start pulse INTP is generated.

The first shift register 21 may shift the start pulse INTP until a point in time when a first rising edge of the clock signal CLK occurs to generate the first pre-shifted pulse PSP<1> after the start pulse INTP is generated. The first shift register 21 may shift the start pulse INTP until a point in time when a second rising edge of the clock signal CLK occurs to generate the second pre-shifted pulse PSP<2> after the start pulse INTP is generated. The first shift register 21 may shift the start pulse INTP until a point in time when a third rising edge of the clock signal CLK occurs to generate the third pre-shifted pulse PSP<3> after the start pulse INTP is generated. The first shift register 21 may shift the start pulse INTP until a point in time when a fourth rising edge of the clock signal CLK occurs to generate the first transmission shifted pulse TSP<1> after the start pulse INTP is generated. The first shift register 21 may shift the start pulse INTP until a point in time when a fifth rising edge of the clock signal CLK occurs to generate the second transmission shifted pulse TSP<2> after the start pulse INTP is generated. The first shift register 21 may shift the start pulse INTP until a point in time when a sixth rising edge of the clock signal CLK occurs to generate the third transmission shifted pulse TSP<3> after the start pulse INTP is generated. The first shift register 21 may shift the start pulse INTP until a point in time when a seventh rising edge of the clock signal CLK occurs to generate the fourth transmission shifted pulse TSP<4> after the start pulse INTP is generated. The first shift register 21 may shift the start pulse INTP until a point in time when an eighth rising edge of the clock signal CLK occurs to generate the fifth transmission shifted pulse TSP<5> after the start pulse INTP is generated. The first shift register 21 may shift the start pulse INTP until a point in time when a ninth rising edge of the clock signal CLK occurs to generate the sixth transmission shifted pulse TSP<6> after the start pulse INTP is generated. The first shift register 21 may shift the start pulse INTP until a point in time when a tenth rising edge of the clock signal CLK occurs to generate the seventh transmission shifted pulse TSP<7> after the start pulse INTP is generated. The first shift register 21 may shift the start pulse INTP until a point in time when an eleventh rising edge of the clock signal CLK occurs to generate the transmission start pulse TINTP after the start pulse INTP is generated.

Figure 11:
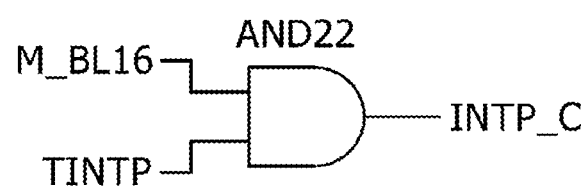
FIG. 11 shows a circuit diagram illustrating an example of a continuation start pulse generation circuit included in the semiconductor device of FIG. 9.

Referring to FIG. 11, the continuation start pulse generation circuit 22 may include an AND gate AND22. The AND gate AND22 may perform a logical AND operation of the transmission start pulse TINTP and the burst length information signal M_BL16 to generate the continuation start pulse INTP_C. The continuation start pulse generation circuit 22 may output the transmission start pulse TINTP as the continuation start pulse INTP_C if the burst length information signal M_BL16 having a logic "high" level is inputted to the continuation start pulse generation circuit 22 while the burst length is set as 'BL16.' The continuation start pulse generation circuit 22 may generate the continuation start pulse INTP_C having a logic "low" level if the burst length is set as 'BL8.'

Figure 12:
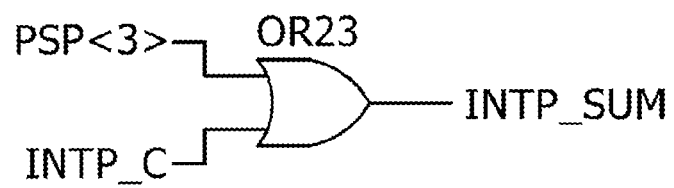
FIG. 12 shows a circuit diagram illustrating an example of a synthesis start pulse generation circuit included in the semiconductor device of FIG. 9.

Referring to FIG. 12, the synthesis start pulse generation circuit 23 may include an OR gate OR23. The OR gate OR23 may perform a logical OR operation of the third pre-shifted pulse PSP<3> and the continuation start pulse INTP_C to generate the synthesis start pulse INTP_SUM. The synthesis start pulse generation circuit 23 may generate the synthesis start pulse INTP_SUM having a logic "high" level if the third pre-shifted pulse PSP<3> is generated to have a logic "high" level or the continuation start pulse INTP_C is generated to have a logic "high" level.

Figure 13:
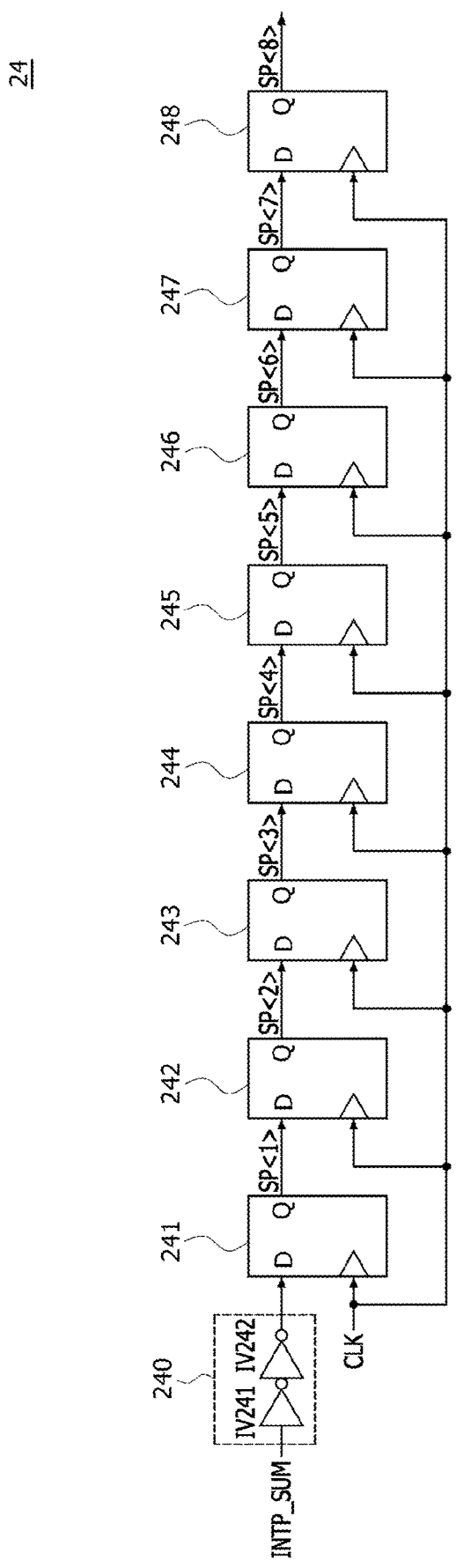
FIG. 13 shows a circuit diagram illustrating an example of a second shift register included in the semiconductor device of FIG. 9.

Referring to FIG. 13, the second shift register 24 may include a delay circuit 240 and first to eighth latch circuits 241~248.

The delay circuit 240 may include inverters IV241 and IV242. The delay circuit 240 may delay the synthesis start pulse INTP_SUM by a delay period set by the inverters IV241 and IV242 to output the delayed synthesis start pulse. Even though the synthesis start pulse INTP_SUM is generated in synchronization with a rising edge of the clock signal CLK, the first shifted pulse SP<1> may be created in synchronization with a rising edge of the clock signal CLK after the synthesis start pulse INTP_SUM is generated because the synthesis start pulse INTP_SUM is delayed and outputted by the delay circuit 240.

Each of the first to eighth latch circuits 241~248 may be realized using a D-flipflop. The first latch circuit 241 may shift an output pulse of the delay circuit 240 in synchronization with a first rising edge of the clock signal CLK to generate and output the first shifted pulse SP<1> after the synthesis start pulse INTP_SUM is generated. The second latch circuit 242 may shift the first shifted pulse SP<1> in synchronization with a second rising edge of the clock signal CLK to generate and output the second shifted pulse SP<2> after the synthesis start pulse INTP_SUM is generated. The third latch circuit 243 may shift the second shifted pulse SP<2> in synchronization with a third rising edge of the clock signal CLK to generate and output the third shifted pulse SP<3> after the synthesis start pulse INTP_SUM is generated. The fourth latch circuit 244 may shift the third shifted pulse SP<3> in synchronization with a fourth rising edge of the clock signal CLK to generate and output the fourth shifted pulse SP<4> after the synthesis start pulse INTP_SUM is generated. The fifth latch circuit 245 may shift the fourth shifted pulse SP<4> in synchronization with a fifth rising edge of the clock signal CLK to generate and output the fifth shifted pulse SP<5> after the synthesis start pulse INTP_SUM is generated. The sixth latch circuit 246 may shift the fifth shifted pulse SP<5> in synchronization with a sixth rising edge of the clock signal CLK to generate and output the sixth shifted pulse SP<6> after the synthesis start pulse INTP_SUM is generated. The seventh latch circuit 247 may shift the sixth shifted pulse SP<6> in synchronization with a seventh rising edge of the clock signal CLK to generate and output the seventh shifted pulse SP<7> after the synthesis start pulse INTP_SUM is generated. The eighth latch circuit 248 may shift the seventh shifted pulse SP<7> in synchronization with an eighth rising edge of the clock signal CLK to generate and output the eighth shifted pulse SP<8> after the synthesis start pulse INTP_SUM is generated.

The second shift register 24 may shift the synthesis start pulse INTP_SUM until a point in time when a first rising edge of the clock signal CLK occurs to generate the first shifted pulse SP<1> after the synthesis start pulse INTP_SUM is generated. The second shift register 24 may shift the synthesis start pulse INTP_SUM until a point in time when a second rising edge of the clock signal CLK occurs to generate the second shifted pulse SP<2> after the synthesis start pulse INTP_SUM is generated. The second shift register 24 may shift the synthesis start pulse INTP_SUM until a point in time when a third rising edge of the clock signal CLK occurs to generate the third shifted pulse SP<3> after the synthesis start pulse INTP_SUM is generated. The second shift register 24 may shift the synthesis start pulse INTP_SUM point in time until a point in time when a fourth rising edge of the clock signal CLK occurs to generate the fourth shifted pulse SP<4> after the synthesis start pulse INTP_SUM is generated. The second shift register 24 may shift the synthesis start pulse INTP_SUM point in time until a point in time when a fifth rising edge of the clock signal CLK occurs to generate the fifth shifted pulse SP<5> after the synthesis start pulse INTP_SUM is generated. The second shift register 24 may shift the synthesis start pulse INTP_SUM point in time until a point in time when a sixth rising edge of the clock signal CLK occurs to generate the sixth shifted pulse SP<6> after the synthesis start pulse INTP_SUM is generated. The second shift register 24 may shift the synthesis start pulse INTP_SUM point in time until a point in time when a seventh rising edge of the clock signal CLK occurs to generate the seventh shifted pulse SP<7> after the synthesis start pulse INTP_SUM is generated. The second shift register 24 may shift the synthesis start pulse INTP_SUM point in time until a point in time when an eighth rising edge of the clock signal CLK occurs to generate the eighth shifted pulse SP<8> after the synthesis start pulse INTP_SUM is generated.

Figure 14:
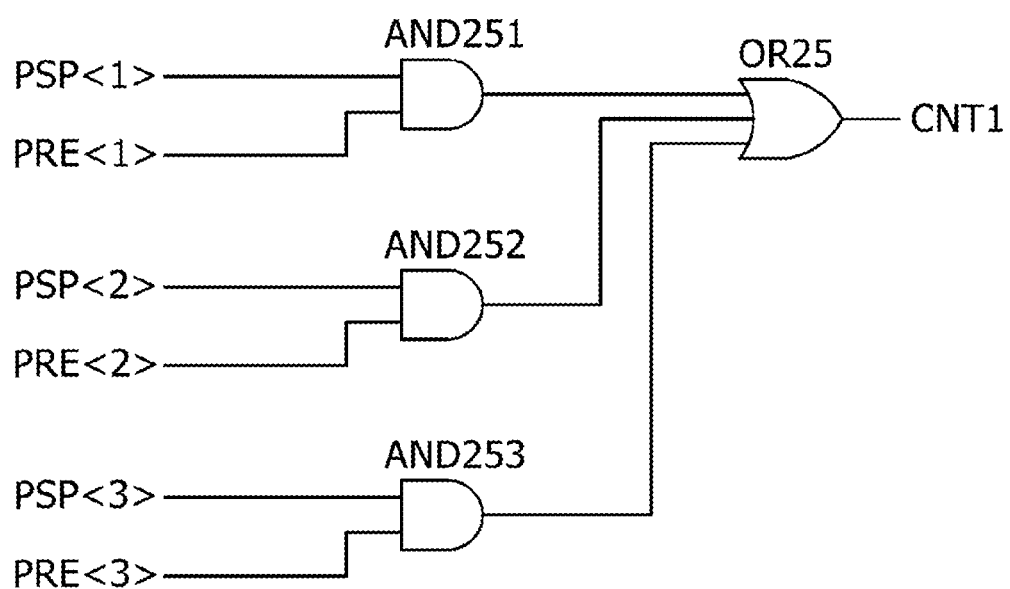
FIG. 14 shows a circuit diagram illustrating an example of a first control signal generation circuit included in the semiconductor device of FIG. 9.

Referring to FIG. 14, the first control signal generation circuit 25 may include AND gates AND251, AND252, and AND253 and an OR gate OR25. The AND gate AND251 may perform a logical AND operation of the first pre-shifted pulse PSP<1> and the first pre-code PRE<1>. The AND gate AND252 may perform a logical AND operation of the second pre-shifted pulse PSP<2> and the second pre-code PRE<2>. The AND gate AND253 may perform a logical AND operation of the third pre-shifted pulse PSP<3> and the third pre-code PRE<3>. The OR gate OR25 may perform a logical OR operation of output signals of the AND gates AND251, AND252, and AND253 to generate the first control signal CNT1.

The first control signal generation circuit 25 may generate the first control signal CNT1 whose enabled period is set by at least one of the first to third pre-shifted pulses PSP<1:3> according to a logic level combination of the first to third pre-codes PRE<1:3>. For example, the first control signal generation circuit 25 may generate the first control signal CNT1 from the third pre-shifted pulse PSP<3> if the first to third pre-codes PRE<1:3> have a logic level combination of '001,' the first control signal generation circuit 25 may generate the first control signal CNT1 by performing a logical OR operation of the second and third pre-shifted pulses PSP<2:3> if the first to third pre-codes PRE<1:3> have a logic level combination of '011,' and the first control signal generation circuit 25 may generate the first control signal CNT1 by performing a logical OR operation of the first to third pre-shifted pulses PSP<1:3> if the first to third pre-codes PRE<1:3> have a logic level combination of '111.'

Figure 15:
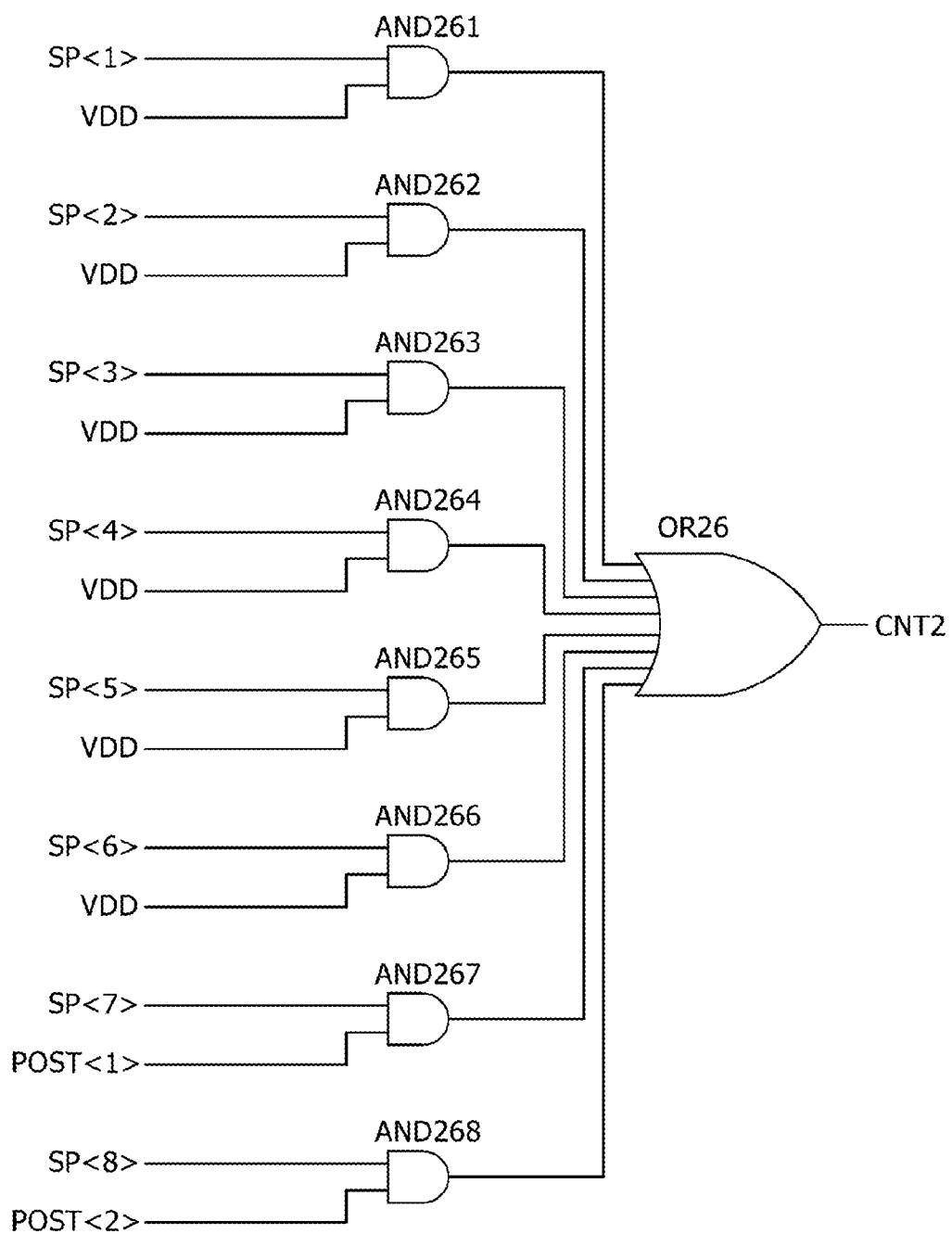
FIG. 15 shows a circuit diagram illustrating an example of a second control signal generation circuit included in the semiconductor device of FIG. 9.

Referring to FIG. 15, the second control signal generation circuit 26 may include AND gates AND261~AND268 and an OR gate OR26. The AND gate AND261 may perform a logical AND operation of the first shifted pulse SP<1> and a power supply voltage VDD. The AND gate AND262 may perform a logical AND operation of the second shifted pulse SP<2> and the power supply voltage VDD. The AND gate AND263 may perform a logical AND operation of the third shifted pulse SP<3> and the power supply voltage VDD. The AND gate AND264 may perform a logical AND operation of the fourth shifted pulse SP<4> and the power supply voltage VDD. The AND gate AND265 may perform a logical AND operation of the fifth shifted pulse SP<5> and the power supply voltage VDD. The AND gate AND266 may perform a logical AND operation of the sixth shifted pulse SP<6> and the power supply voltage VDD. The AND gate AND267 may perform a logical AND operation of the seventh shifted pulse SP<7> and the first post-code POST<1>. The AND gate AND268 may perform a logical AND operation of the eighth shifted pulse SP<8> and the second post-code POST<2>. The OR gate OR26 may perform a logic OR operation of output signals of the AND gates AND261~AND268 to generate the second control signal CNT2.

The second control signal generation circuit 26 may set an enabled period of the second control signal CNT2 in response to the first to eighth shifted pulses SP<1:8> according to a logic level combination of the first and second post-codes POST<1:2>. For example, the second control signal generation circuit 26 may generate the second control signal CNT2 which is enabled during a period that the first to eighth shifted pulses SP<1:8> are created if the first and second post-codes POST<1:2> are initialized to have the initialized logic level combination of '11,' the second control signal generation circuit 26 may generate the second control signal CNT2 which is enabled during a period that the first to seventh shifted pulses SP<1:7> are created if the first and second post-codes POST<1:2> have a logic level combination of '10', and the second control signal generation circuit 26 may generate the second control signal CNT2 which is enabled during a period that the first to sixth shifted pulses SP<1:6> are created if the first and second post-codes POST<1:2> have a logic level combination of '00.' For the first and second post-codes POST<1:2>, the logic level combination of '10' means that the first post-code POST<1> has a logic "high" level and the second post-code POST<2> has a logic "low" level.

Figure 16:
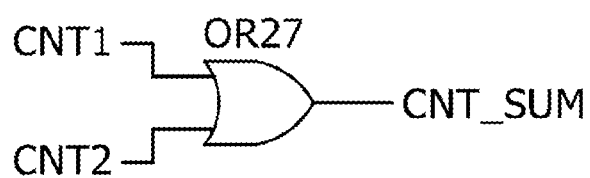
FIG. 16 shows a circuit diagram illustrating an example of a control signal synthesis circuit included in the semiconductor device of FIG. 9.

Referring to FIG. 16, the control signal synthesis circuit 27 may include an OR gate OR27. The OR gate OR27 may perform a logical OR operation of the first control signal CNT1 and the second control signal CNT2 to generate the synthesized control signal CNT_SUM. The control signal synthesis circuit 27 may generate the synthesized control signal CNT_SUM which is enabled during the preamble period that the first control signal CNT1 is enabled and during the burst operation period that the second control signal CNT2 is enabled.

Operations of the semiconductor device 200 having the aforementioned configuration are described hereinafter with reference to FIGS. 17 and 18 in conjunction with an operation for setting the preamble period before a burst operation is performed and the burst operation performed while the burst length is set as 'BL16.'

Figure 17:
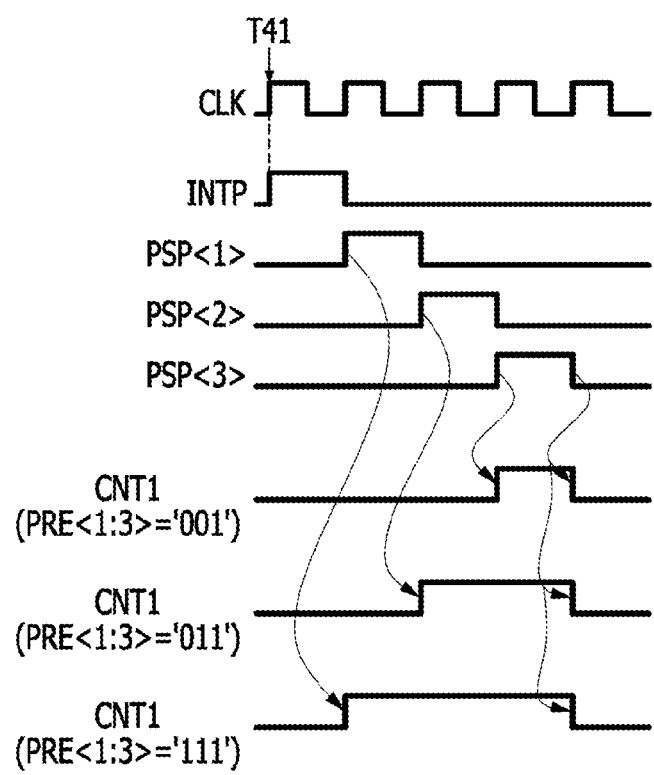
FIGS. 17 and 18 show timing diagrams illustrating operations of the semiconductor device shown in FIGS. 9 to 16.

Referring to FIG. 17, the operation for setting the preamble period in advance of the burst operation is illustrated. As illustrated in FIG. 17, if the start pulse INTP is created at a point in time 'T41,' the start pulse INTP may be successively shifted in synchronization with the clock signal CLK to sequentially generate the first to third pre-shifted pulses PSP<1:3>. The preamble period may be set as an enabled period of the first control signal CNT1. The preamble period may be controlled according to a logic level combination of the first to third pre-codes PRE<1:3>. For example, the preamble period may be set as a period that the third pre-shifted pulse PSP<3> is created if the first to third pre-codes PRE<1:3> have a logic level combination of '001,' the preamble period may be set as a period that the second and third pre-shifted pulses PSP<2:3> are created if the first to third pre-codes PRE<1:3> have a logic level combination of '011,' and the preamble period may be set as a period that the first to third pre-shifted pulses PSP<1:3> are created if the first to third pre-codes PRE<1:3> have a logic level combination of '111.'

Figure 18:
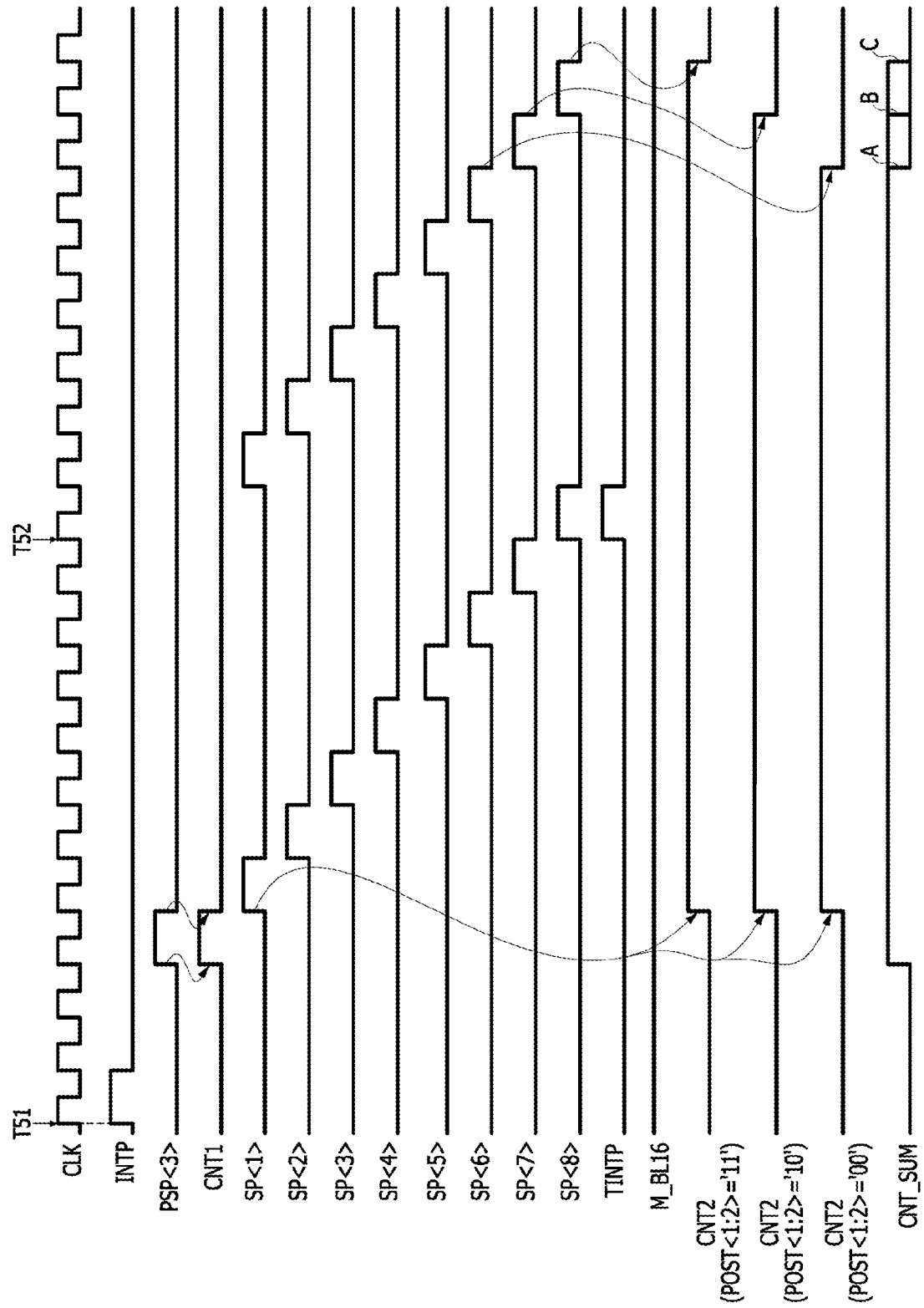

Referring to FIG. 18, the burst operation performed while the burst length information signal M_BL16 has a logic "high" level according to the burst length set as 'BL16' is illustrated. As illustrated in FIG. 18, if the start pulse INTP is created in synchronization with a point in time "T51," the first control signal CNT1 enabled during the preamble period may be generated as described with reference to FIG. 17. The following description is developed under the assumption that the preamble period is set as a period that the third pre-shifted pulse PSP<3> is created according to the first to third pre-codes PRE<1:3> having a logic level combination of '001.' The third pre-shifted pulse PSP<3> may be repeatedly shifted in synchronization with pulses of the clock signal CLK to sequentially generate the first to eighth shifted pulses SP<1:8> firstly. The transmission start pulse TINTP may be generated at a point in time "T52" that the eighth shifted pulse SP<8> is created, and the transmission start pulse TINTP may be repeatedly shifted in synchronization with pulses of the clock signal CLK to sequentially generate the first to eighth shifted pulses SP<1:8> secondly. A period that the burst operation is performed may be set as a period that the second control signal CNT2 is enabled to have a logic "high" level. An enabled period of the second control signal CNT2 may be set by the first to eighth shifted pulses SP<1:8> according to a logic level combination of the first and second post-codes POST<1:2>. If the first and second post-codes POST<1:2> are initialized to have a logic level combination of '11' after the point in time "T52," the second control signal CNT2 may maintain an enabled state (i.e., a logic "high" level) during a period that the first to eighth shifted pulses SP<1:8> are created. If the first and second post-codes POST<1:2> are initialized to have a logic level combination of '10' after the point in time "T52," the second control signal CNT2 may maintain an enabled state (i.e., a logic "high" level) during a period that the first to seventh shifted pulses SP<1:7> are created. If the first and second post-codes POST<1:2> are initialized to have a logic level combination of '00' after the point in time "T52," the second control signal CNT2 may maintain an enabled state (i.e., a logic "high" level) during a period that the first to sixth shifted pulses SP<1:6> are created. The synthesized control signal CNT_SUM may be enabled during the preamble period that the first control signal CNT1 is enabled and during the burst operation period that the second control signal CNT2 is enabled. An enabled period of the synthesized control signal CNT_SUM may be set as a period indicated by a symbol 'A' if the first and second post-codes POST<1:2> have a logic level combination of '00,' may be set as a period indicated by a symbol 'B' if the first and second post-codes POST<1:2> have a logic level combination of '10,' and may be set as a period indicated by a symbol 'C' if the first and second post-codes POST<1:2> have a logic level combination of '11.'

According to the embodiments described above, even though a burst length mode is changed, a control signal for controlling a burst operation may be generated, even without design change, to increase the integration density of semiconductor devices and to reduce power consumption of the semiconductor devices.

Figure 19:
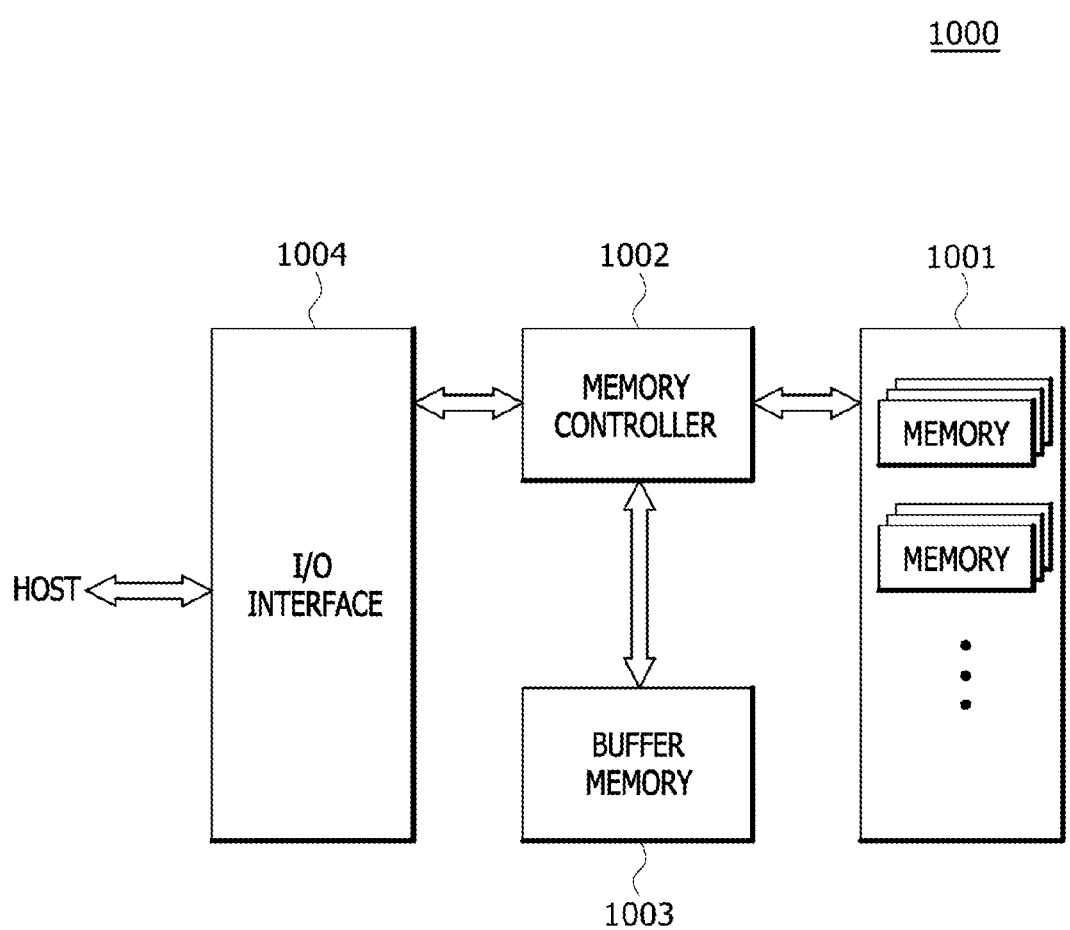
FIG. 19 shows a block diagram illustrating a configuration of an electronic system employing the semiconductor device shown in FIG. 1.

The semiconductor devices described with reference to FIGS. 1 to 18 may be applied to an electronic system that includes a memory system, a graphic system, a computing system, a mobile system, or the like. For example, as illustrated in FIG. 19, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include at least one of the semiconductor devices illustrated in FIGS. 1 and 9. Meanwhile, the data storage circuit 1001 may include a nonvolatile memory that can retain its stored data even when its power supply is interrupted. The nonvolatile memory may be a flash memory (e.g., a NOR-type flash memory or a NAND-type flash memory), a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 19 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a shift register configured to generate shifted pulses, wherein a number of the shifted pulses is controlled according to a mode of a burst length; and
a control signal generation circuit configured to generate a control signal for setting a burst operation period according to a period during which the shifted pulses are created,
wherein the burst operation period is a period during which a burst operation is performed, and data having a plurality of bits are successively inputted to the semiconductor device by a write command or successively outputted from the semiconductor device by a read command based on the mode of the burst length.

2. The semiconductor device of claim 1,
wherein the shifted pulses are generated once when the mode of the burst length is set to a first mode; and
wherein the shifted pulses are generated twice when the mode of the burst length is set to a second mode.

3. The semiconductor device of claim 1,
wherein data having eight bits are successively inputted to the semiconductor device by the write command or successively outputted from the semiconductor device by the read command when the mode of the burst length is set to a first mode; and
wherein data having sixteen bits are successively inputted to the semiconductor device by the write command or successively outputted from the semiconductor device by the read command when the mode of the burst length is set to a second mode.

4. The semiconductor device of claim 1,
wherein the shifted pulses comprise a first shifted pulse and a second shifted pulse; and
wherein the shift register shifts a synthesis start pulse in synchronization with a clock signal to sequentially generate the first shifted pulse and the second shifted pulse.

5. The semiconductor device of claim 4,
wherein the shift register shifts the synthesis start pulse in synchronization with a predetermined edge of the clock signal to generate the first shifted pulse after the synthesis start pulse is generated; and
wherein the shift register shifts the first shifted pulse by one cycle of the clock signal to generate the second shifted pulse.

6. The semiconductor device of claim 4, further comprising a synthesis start pulse generation circuit configured to generate the synthesis start pulse when a start pulse or a continuation start pulse is generated.

7. The semiconductor device of claim 6, wherein the start pulse is generated to perform a data input/output (I/O) operation according to the write command or the read command.

8. The semiconductor device of claim 6,
wherein the continuation start pulse is not generated while the mode of the burst length is set to a first mode; and
wherein the continuation start pulse is generated from the second shifted pulse while the mode of the burst length is set to a second mode.

9. The semiconductor device of claim 1,
wherein the shifted pulses comprise a first shifted pulse and a second shifted pulse; and
wherein the control signal generation circuit generates the control signal which is enabled during a period during which the first shifted pulse or the second shifted pulse is generated.

10. A semiconductor device comprising:
a first control signal generation circuit configured to generate a first control signal for setting a preamble period which is controlled according to pre-codes;
a second control signal generation circuit configured to generate a second control signal for setting a period for a burst operation in response to post-codes and shifted pulses, wherein a number of the shifted pulses is controlled according to a mode of a burst length; and
a control signal synthesis circuit configured to synthesize the first control signal and the second control signal to generate a synthesized control signal.

11. The semiconductor device of claim 10, wherein the first control signal generation circuit generates the first control signal from pre-shifted pulses according to a logic level combination of the pre-codes.

12. The semiconductor device of claim 11,
wherein the pre-shifted pulses comprise a first pre-shifted pulse and a second pre-shifted pulse;
wherein the first control signal generation circuit generates the first control signal which is enabled while the first pre-shifted pulse and the second pre-shifted pulse are created when the pre-codes have a first logic level combination; and
wherein the first control signal generation circuit generates the first control signal which is enabled while the second pre-shifted pulse is created when the pre-codes have a second logic level combination.

13. The semiconductor device of claim 10, further comprising a first shift register configured to shift a start pulse in synchronization with a clock signal to generate pre-shifted pulses and a transmission start pulse,
wherein the pre-shifted pulses are inputted to the first control signal generation circuit.

14. The semiconductor device of claim 13,
wherein the pre-shifted pulses comprise a first pre-shifted pulse and a second pre-shifted pulse;
wherein the first shift register shifts the start pulse in synchronization with a predetermined edge of the clock signal to generate the first pre-shifted pulse;
wherein the first shift register shifts the first pre-shifted pulse by one cycle of the clock signal to generate the second pre-shifted pulse; and
wherein the first shift register shifts the second pre-shifted pulse by a period corresponding to 'N' times a cycle of the clock signal to generate the transmission start pulse,
wherein 'N' is set as the number of bits included in data which are transmitted according to the burst length.

15. The semiconductor device of claim 13, wherein the pre-shifted pulses comprise a first pre-shifted pulse and a second pre-shifted pulse, the semiconductor device further comprising:
a synthesis start pulse generation circuit configured to generate a synthesis start pulse in response to the second pre-shifted pulse and a continuation start pulse; and
a second shift register configured to shift the synthesis start pulse in synchronization with the clock signal to generate the shifted pulses.

16. The semiconductor device of claim 15, wherein the continuation start pulse is generated from the transmission start pulse while the mode of the burst length is set to a second mode.

17. The semiconductor device of claim 16,
wherein the shifted pulses are generated once when the mode of the burst length is set to a first mode; and wherein the shifted pulses are generated twice when the mode of the burst length is set to the second mode.

18. The semiconductor device of claim 10, wherein the second control signal generation circuit generates the second control signal from the shifted pulses according to a logic level combination of the post-codes.

19. The semiconductor device of claim 18,
wherein the shifted pulses comprise a first shifted pulse, a second shifted pulse, and a third shifted pulse;
wherein the second control signal generation circuit generates the second control signal which is enabled while the first to third shifted pulses are created when the post-codes have a first logic level combination;
wherein the second control signal generation circuit generates the second control signal which is enabled while the first and second shifted pulses are created when the post-codes have a second logic level combination; and
wherein the second control signal generation circuit generates the second control signal which is enabled while the first shifted pulse is created when the post-codes have a third logic level combination.

20. The semiconductor device of claim 10, wherein the synthesized control signal is enabled during a period during which the first control signal is enabled and during a period during which the second control signal is enabled.

* * * * *